(12) United States Patent
Van Herpen et al.

(10) Patent No.: US 8,382,319 B2
(45) Date of Patent: Feb. 26, 2013

(54) LIGHT OUTPUT DEVICE

(75) Inventors: Maarten Marinus Johannes Wilhelmus Van Herpen, Eindhoven (NL); Alexander Henricus Waltherus Van Eeuwijk, Eindhoven (NL); Eduard Matheus Johannes Niessen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 695 days.

(21) Appl. No.: 12/593,317

(22) PCT Filed: Mar. 31, 2008

(86) PCT No.: PCT/IB2008/051193
§ 371 (c)(1),
(2), (4) Date: Sep. 28, 2009

(87) PCT Pub. No.: WO2008/120165
PCT Pub. Date: Oct. 9, 2008

(65) Prior Publication Data
US 2010/0110675 A1 May 6, 2010

(30) Foreign Application Priority Data

Apr. 3, 2007 (EP) ..................................... 07105533

(51) Int. Cl.
*F21V 33/00* (2006.01)
(52) U.S. Cl. ........................................ 362/234; 362/307
(58) Field of Classification Search .................. 362/234, 362/307; 349/193; 313/498–512
See application file for complete search history.

(56) References Cited

U.S. PATENT DOCUMENTS

| 5,218,351 | A | 6/1993 | Hashikawa |
| 6,897,936 | B1 | 5/2005 | Li et al. |
| 7,446,347 | B2 * | 11/2008 | Bogner et al. ................... 257/99 |
| 2006/0203517 | A1 | 9/2006 | Kang et al. |
| 2007/0279551 | A1 * | 12/2007 | Umebayashi ................... 349/65 |
| 2009/0141001 | A1 * | 6/2009 | Kuroda et al. ................ 345/175 |

FOREIGN PATENT DOCUMENTS

| EP | 1437215 A1 | 7/2004 |
| WO | 2005029170 A1 | 3/2005 |
| WO | 2005097551 A1 | 10/2005 |
| WO | 2007007235 A2 | 1/2007 |
| WO | 2009040724 A2 | 4/2009 |

* cited by examiner

*Primary Examiner* — Anne Hines
(74) *Attorney, Agent, or Firm* — David Zivan; Mark Beloborodov

(57) ABSTRACT

A light output device comprises a first and a second substrate arrangement (1,2), the first substrate arrangement (1) comprising a light output surface of the device. An electrode arrangement (3a,3b) is sandwiched between the substrate arrangements and at least one light source (4) is connected to the electrode arrangement. The first substrate (1) arrangement comprises a light diffuser for changing the level of uniformity of the light output from the light source and the second substrate (2) arrangement comprises a light scattering or reflecting layer. This arrangement uses a scattering substrate arrangement for the substrate from which illumination is provided. In order to enhance the level of uniformity, the opposite substrate arrangement is also either scattering or reflecting.

16 Claims, 8 Drawing Sheets

LIGHT OUTPUT DEVICE

TECHNICAL FIELD OF THE INVENTION

This invention relates to light output devices, in particular using discrete light sources associated with a transparent substrate structure.

TECHNICAL BACKGROUND

One known example of this type of lighting device is a so-called "LED in glass" device. An example is shown in FIG. 1. Typically a glass plate is used, with a transparent conductive coating (for example ITO) forming electrodes. The conductive coating is patterned in order to make the electrodes that are connected to a semiconductor LED device. The assembly is completed by laminating the glass, with the LEDs inside a thermoplastic layer (for example polyvinyl butyral, PVB).

Applications of this type of device are shelves, showcases, facades, office partitions, wall cladding, and decorative lighting. The lighting device can be used for illumination of other objects, for display of an image, or simply for decorative purposes.

One problem with this type of device is that semiconductor LEDs are in approximation point sources. As a result, the LEDs appear as bright dots of light, which is not always preferred, and does not give uniform illumination.

Another problem with this type of device is that there is not much flexibility to provide a time-varying output, or to provide different output effects.

SUMMARY OF THE INVENTION

It is a first object of the invention to control the level of uniformity of the illumination from a discrete light source or sources used in a device in which the light source(s) are integrated into the substrate structure of the device.

According to a first aspect of the invention, there is provided a light output device comprising:

a first substrate arrangement comprising a light output surface of the device and comprising means for controlling the level of uniformity of the light output from the light output surface;

a second substrate arrangement comprising light deflecting means;

an electrode arrangement provided between the first and the second substrate arrangement and comprising at least semi-transparent electrodes;

at least one light source provided between the first and the second substrate arrangement and electrically driven by the electrodes.

The device of this aspect of the invention uses an arrangement for the substrate from which illumination is provided which controls (e.g. increases) the level of uniformity of the light, for example a scattering substrate. A higher level of uniformity of the light is to be understood to mean a more uniform light output.

The second substrate arrangement comprises light deflecting means (either scattering or reflecting). The light reaches the second substrate arrangement through substantially transparent electrodes. The substantially transparent electrodes are not visible or almost not visible to the viewer, and they do not introduce significant non-uniformities to the light output.

The effect of the reflection/scattering from the second substrate arrangement is to increase the scattering of light, as additional light directed towards the second substrate arrangement is returned to the first substrate arrangement. This increases the light output from the output surface, but still enables light to be emitted from both substrates on opposite sides of the light source.

The first substrate arrangement can be switchable between a substantially transparent state and a state which provides a different (e.g. increased) level of uniformity of the light output from the light output surface. This provides a variable arrangement, which may be a foil, in order to switch between uniform illumination and spot illumination.

In a further embodiment, both substrate arrangements are switchable, such that the entire device may be switched. This gives a fully transparent system when both substrate arrangements are switched to their transparent state.

In one arrangement, the means for increasing the level of uniformity has a stronger effect in a region corresponding to the location of the light source, and weaker effect at a region remote from the light source.

It is another object of the invention to provide switchable control of the nature of the light output from a light source associated with a substrate arrangement.

According to a second aspect of the invention, there is provided a light output device comprising:

a first substrate arrangement comprising a light output surface of the device and comprising means for controlling the level of uniformity of the light output from the light output surface;

a second substrate arrangement comprising light deflecting means;

at least one light source having its output optically coupled to a space between the substrate arrangements, wherein the first substrate arrangement is switchable between at least two states having different levels of uniformity of the light output from the light output surface.

This enables different output effects to be provided. For example, the device can be switched between a spot illumination mode and a more diffuse illumination mode. This flexibility can be used to provide time-dependent lighting effects. If the switching can be localized to sub-areas, position-dependent lighting effects can also be produced (for example low resolution images, or simply a mixture of spot and diffuse illumination for different areas).

The light output may be from only one surface (in which case the opposite substrate/electrodes do not need to be transparent) or it may be from both sides.

In an embodiment the at least one light source is provided between the first and the second substrate arrangement.

The device may further comprise an electrode arrangement sandwiched between the substrate arrangements, wherein the at least one light source is connected to the electrode arrangement. This provides a fully integrated version.

The first substrate arrangement may comprise a glass layer having embedded scattering particles, for example milk glass.

Alternatively, the first substrate arrangement can comprise a transparent glass layer and a diffuser layer.

The light deflecting means of the second substrate can be reflecting or scattering. The effect of the reflection/scattering from the second substrate arrangement is to increase the scattering of light, as additional light directed towards the second substrate arrangement is returned to the first substrate arrangement. This increases the light output from the output surface, but still enables light to be emitted from both substrates on opposite sides of the light source.

In one arrangement, the means for increasing the level of uniformity has a stronger effect in a region corresponding to the location of the light source, and weaker effect at a region remote from the light source.

The first substrate arrangement may have a non-uniform thickness, having increased thickness at a region corresponding to the location of the light source, and a reduced thickness at a region remote from the light source.

Alternatively, the first substrate arrangement can have a non-uniform density of scattering particles, having increased density at a region corresponding to the location of the light source, and a reduced density at a region remote from the light source.

These arrangements enhance the level of uniformity further.

For the electrically switchable implementations, the first substrate arrangement can comprise an LC layer sandwiched between electrode layers.

Different regions of the first substrate arrangement can then be independently switchable.

Preferably, at least eight portions of the first substrate arrangement can be addressed independently, so that a relatively high multiplex ratio is obtained.

An alternative switchable device is a suspended particle device, and this can provide a switchable reflective layer or a switchable scattering layer. This can be used to provide electrical switching capability for the first and/or second substrate arrangement, In a further example, the second substrate is switchable between a substantially transparent state and a reflecting state. This enables the whole device to be switchable between a transparent mode and a uniform illumination mode.

Preferably, the light source comprises an LED device or a group of LED devices (for example OLED devices), and these may illuminate one or both substrates. However, other light sources may be used, and the arrangement of the invention generally enables a first light output (e.g. spot) to be converted into a light output with a different level of uniformity (e.g. increased uniformity). Preferably, the device comprises an array of the light sources.

BRIEF DESCRIPTION OF THE DRAWINGS

Examples of the invention will now be described in detail with reference to the accompanying drawings, in which.

The same reference numerals are used to denote similar parts throughout the Figures.

DETAILED DESCRIPTION OF EMBODIMENTS OF THE INVENTION

Figure 1:
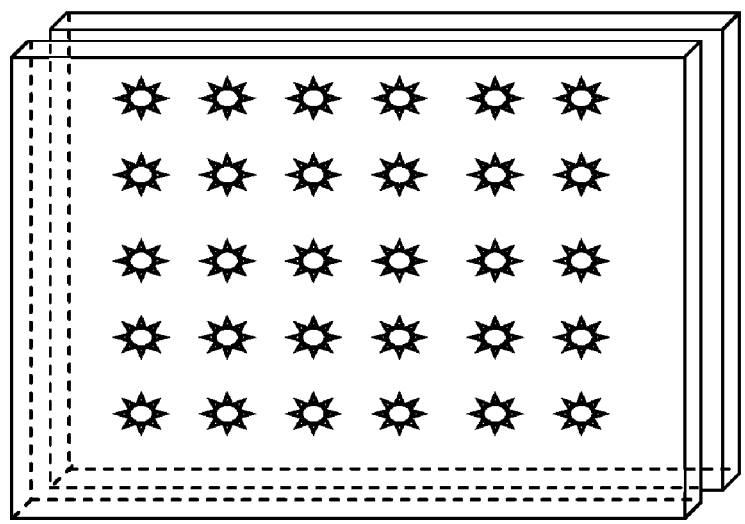
FIG. 1 shows a known LED in glass illumination device.
Figure 2:
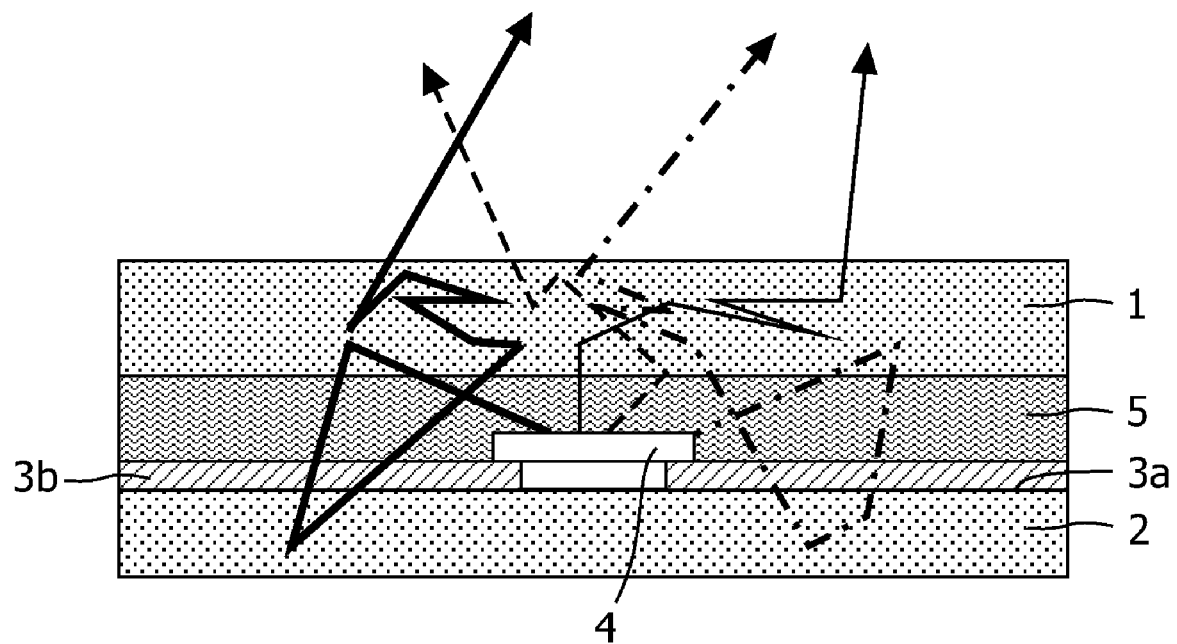
FIG. 2 shows a first example of light output device of the invention.

FIG. 2 shows a first embodiment of device in accordance with the invention. The light output device comprises glass plates 1 and 2. Between the glass plates are (semi-) transparent electrodes 3*a* and 3*b* (for example formed using ITO or thin conductive wires), and a LED 4 connected to the transparent electrodes 3*a* and 3*b*. A layer of thermoplastic material 5 is provided between glass plates 1 and 2 (for example PVB or UV resin).

Because transparent electrodes are used, they are not visible to the viewer, and they do not introduce non-uniformities to the light output.

The electrodes are preferably substantially transparent, by which is meant that they are imperceptible to a viewer in normal use of the device. If the conductor arrangement does not introduce a noticeable variation in light transmission (for example because it is not patterned, or because the pattern cannot be seen), a transparency of greater than or equal to 50% may be sufficient for the system to be transparent. More preferably, the transparency is greater than 70%, more preferably 90%, and even more preferably 99%. If the conductor arrangement is patterned (for example because thin wires are used), the transparency is preferably greater than 80%, more preferably 90%, but most preferably greater than 99%.

The electrodes can be made of a transparent material such as ITO or they can be made of an opaque material such as copper but be sufficiently thin so that they are not visible in normal use. Examples of suitable materials are disclosed in U.S. Pat. No. 5,218,351.

In this example, the glass plate 1 acts as light diffuser, in order to distribute the light from LED 4 over a larger emission area, for example it may be milk glass. Glass can be made to be diffusing by the addition of a particulate substance into the glass. For example, tin oxide particles, or small air bubbles may be used. It is also possible to make the surface of the glass rough, such that it scatters more light. Many different additives will be known to those skilled in the art, to give the glass a desired colour, transparency, level of diffusion etc.

The light diffusion is a means for increasing the level of uniformity of the light output. It involves a substantially random redirection of the direction of an incoming light beam, and this can be achieved with scattering particles.

The glass plates typically may have a thickness of 1.1 mm-2.1 mm. The spacing between the electrodes connecting the LED is typically 0.01-3 mm, for example around 0.15 mm. The thermoplastic layer has a thickness of 0.5 mm-2 mm, and the electrical resistance of the electrodes is in the range 1-80 Ohm, or 1-50 Ohm or more preferably 2-20 Ohm, or 10-30 Ohms/square.

In order to increase the homogeneity of the light distribution, the glass plate 2 also deflects incoming light, and thereby also acts either as a reflector or diffuser.

Multiple reflections, especially caused in the diffuser 1, contribute to a very homogeneous distribution of the intensity of the light emerging from the glass plate 1. This enables the structure to be used in a wider variety of applications, where a more uniform light distribution is desired or required.

The glass plate may comprise glass in which scattering particles are embedded in the glass structure. These may be micron sized TiO2 particles or small gas bubbles. As an alternative, the surface of the glass can be treated (roughened) to make it scattering.

Figure 3:
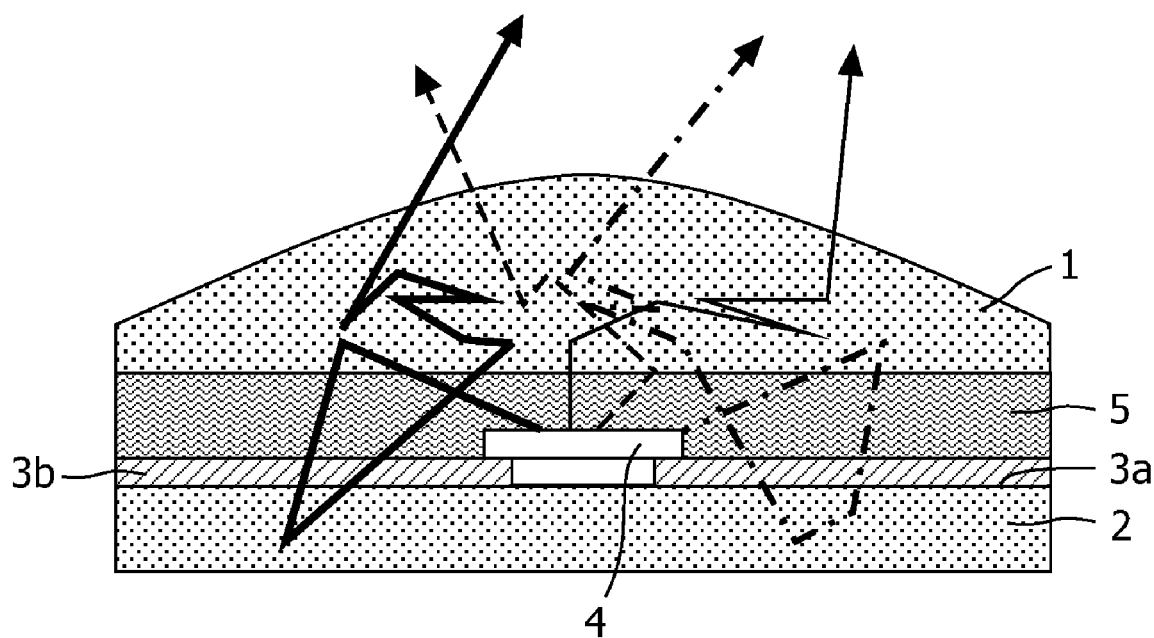
FIG. 3 shows a second example of light output device of the invention.

The uniformity of the light intensity distribution can be further improved using a diffuser 1 with a variation in layer thickness, as shown in FIG. 3. The layer thickness of the diffuser 1 is chosen to be greater immediately opposite the location of the LED 4 than at a further distance from the LED.

Figure 4:
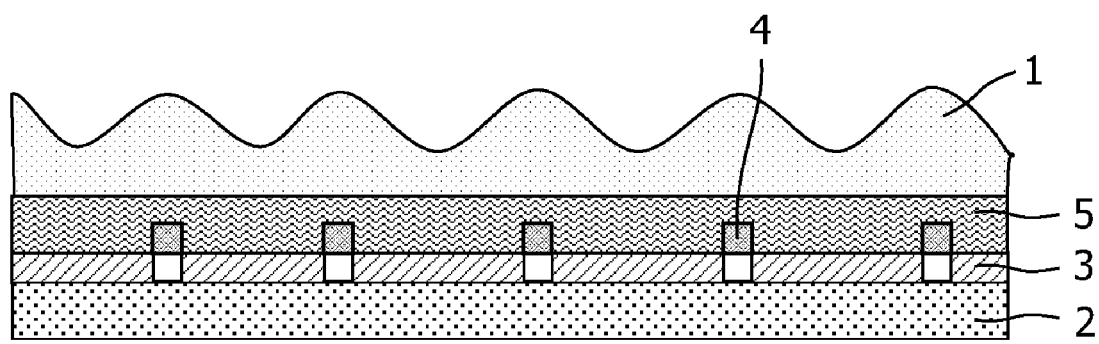
FIG. 4 shows a third example of light output device of the invention.

FIG. 4 shows the structure of FIG. 3 applied to an array of LEDs.

The thickness variation increases the scattering locally at the position of the LEDs. Instead of varying the thickness, it is also possible to vary the amount of scattering particles to achieve the same objective.

These measures preferably provide the transmission of the diffuser at the area where the layer thickness is greatest or the scattering particle density is the greatest of 30%-70% of the transmission of the diffuser at the area where the layer thickness is smallest or the scattering particle density is the lowest. For example, the transmission may be 40%-60%, or 45%-55%.

Figure 5:
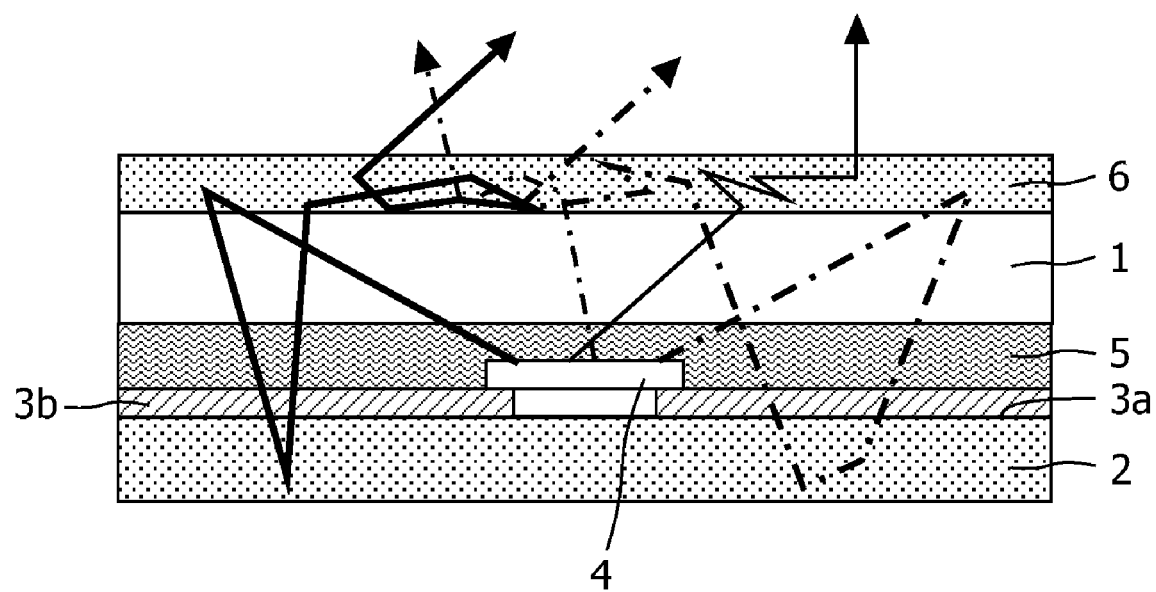
FIG. 5 shows a fourth example of light output device of the invention.

FIG. 5 shows a further embodiment in which the glass plate 1 itself does not provide the diffuser property. Instead, a diffuser layer 6 is applied to the glass plate. Similarly, glass plate 2 may be coated with a diffuser or reflecting layer (not shown).

Particularly suitable materials for the diffuser layer 6 are calcium halophosphate and/or calcium pyrophosphate. The diffuser layer 6 may for example be applied as paint, in which a binder, for example a fluorine copolymer, for example THV, is used, as well as a solvent (for example Mibk).

The examples above all provide a desired more uniform light output.

Figure 6:
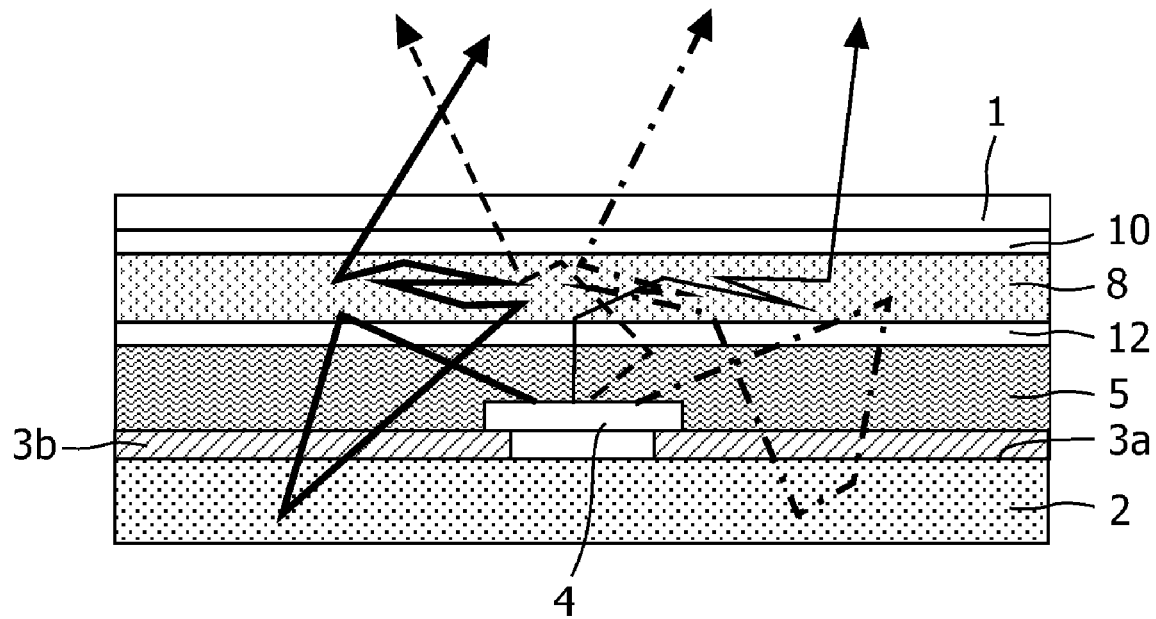
FIG. 6 shows a fifth example of light output device of the invention.

In a further embodiment, an electro-optical switch can be used, which can enable switching between a substantially transparent state and a scattering state. As shown schematically in FIG. 6, this can be implemented using a liquid crystal layer 8 sandwiched between electrode layers 10,12. The electrode layers 10,12 can be formed of transparent electrodes, such as ITO, or indium zinc oxide (IZO). The electrodes can be arranged simply to switch the entire layer of LC material 8, or else a passive matrix array of crossing electrodes can be used so that different portions of the LC layer can be addressed.

The switchable LC layer is provided over the light sources and provides the scattering. The switchable LC arrangement allows the user to switch between spot illumination and uniform illumination.

The bottom glass plate 2 may also be equipped with an electro-optical switch. In this case, it may also be advantageous to use a variable reflective switch.

If both glass plates 1 and 2 are equipped with an electro-optical switch, both plates can be switched to a fully transmissive state, so that the device can function with a fully transparent mode. For example, this transparent mode may be desired when the illumination sources are turned off.

As an example of a variable reflective switch, reference is made to WO 2005/029170. This document discloses a switchable transflector in the form of a suspended particle device. The particles are anisometric reflective particles suspended in an insulating fluid. The suspension is sandwiched between transparent substrates carrying electrodes for electrically controlling the electric field in the device, which in turn induces a dipole in the particles. Further details of the materials that can be used and the control scheme can be found in WO2005/029170. However, other known types of electrically controllable reflector can also be used.

Similarly to the switchable transflector, it is also possible to make a switchable scattering layer using a suspended particle device. In this case the reflective particles are replaced by scattering particles.

A problem with the use of variable thickness layers described above, or the use on non-uniform density of particles is that it is expensive to produce such a structure.

The electro-optical switch described above can be used to overcome this problem. The switch then enables different sections to be controlled individually. This allows the control of the amount of scattering in a particular location, and thus it is able to cause an increase amount of scattering directly opposite to the LED, and a reduced amount of scattering further away from the LEDs.

The control over the amount of scattering may for example be achieved by modulating the electro-optical switch between the scattering and transmissive state such that, on average, a certain amount of scattering is achieved. For example, if the switch is modulated between 50% scattering and 50% transmissive, the amount of scattering will be 50% compared to a non-modulated scattering state.

In the previous embodiments the light source is an embedded LED. However, in general the light source may be any light source that generates spots of light. For example, it is also possible to couple light between two glass plates (which act as a waveguide), and to let the light couple out as spots in certain locations. By being able to couple light into the light guide from light sources having different colours (e.g. red, green, blue), the colour of the light spot generated can be chosen and is tunable.

The techniques described above can of course be applied to other types of light source (for example an OLED, electroluminescent light output device) The examples above have shown the light paths associated with individual light sources. However, it will be understood that the invention is typically implemented as many LED devices, embedded in a large glass plate. A typical distance between the LEDs may be 1 cm to 10 cm, for example approximately 3 cm.

Each light source may also comprise a single LED or multiple LEDs.

The examples above use glass substrates, but it will be apparent that plastic substrates may also be used, for example Perspex, or synthetic resin.

In the switchable form, the upper substrate is described above as an LC device. However, this may instead be implemented as an electrically controllable suspended particle layer.

The examples above also show the use of LEDs integrated into the substrate structure. However, the light sources may be external to the substrate arrangement, and light may instead be coupled from the light sources into the spacing between the substrates. For this purpose, light guides may be provided from an array of light sources into the centre of the substrate arrangement. These light guides can use total internal reflection to contain light from the discrete light source, and have an interruption to the total internal reflection (for example a roughened surface) to allow light to exit from the space between substrates.

In the examples, the LEDs are embedded in a thermoplastic material. It is also possible that the LEDs are embedded in other types of materials, and that they are not embedded in a material at all (thus the LED is in vacuum, or in air).

A small number of possible materials to form the transparent (or at least semi-transparent) electrodes have been outlined above. Other examples can be found in U.S. Pat. No. 5,218,351, and include electrically conductive wires, with a diameter of approximately 0.1 mm spaced by about 10 mm or more, or with a diameter of approximately 20 um and spaced by 1 mm or more. The wires can be made from strands of gold, silver, copper, zinc or stainless steel. Alternatively, strands made of a resin such as polyester or nylon wires can be used, the outer surface of which is coated with metal by vapour deposition, metal plating or the like. Conductive films of vapour-deposited SiO2-indium alloy can also be used.

One particularly preferred material is a conductive ink, which can be deposited by inkjet or silkscreen printing. The ink includes fine metal particles, such as silver, and has a conductance of less than 0.1 Ohm/square/mil. A typical wire width using ink is 0.08 mm to 0.8 mm.

The non-uniformity in the light source arrangement may be characterized as at least 50% of the total light output being concentrated in the areas directly over the light sources. The means for increasing the level of uniformity reduces this figure.

In the example above, the ability to switch the optical characteristics of the device is described as useful for switching between spot and diffuse illumination modes. The switching may be used to obtain time-dependent light output effects.

The use of a switchable scattering layer in the form of a switchable liquid crystal layer has been outlined above, and some further details are now presented. There are difficulties implementing control of different areas of an LC layer using a passive matrix scheme. In particular, the maximum number of rows, corresponding to adjacent strips of the scattering layer that can be electrically independently driven with a certain contrast, in a predetermined period of time, or even simultaneously, is very limited. That means that the multiplex rate is low.

In passive matrix addressing the maximum number of rows (Nmax) that can be driven with a certain contrast is determined by Equation 1, according to Alt & Pleshko (See Alt, P. M., and P. Pleshko. 1974. IEEE Trans. Electron. Devices. ED-21: 146-155):

$$N_{max} = \frac{\{(V_{th} + \Delta V)^2 + V_{th}^2\}^2}{\{(V_{th} + \Delta V)^2 - V_{th}^2\}^2} \quad (1)$$

with $V_{th}$ being the threshold voltage above which the amount of reflection starts to change substantially and $\Delta V$ being the difference between $V_{sat}$ and $V_{th}$ divided by two, with $V_{sat}$ being the voltage above which the reflection does not substantially change anymore.

Figure 7:
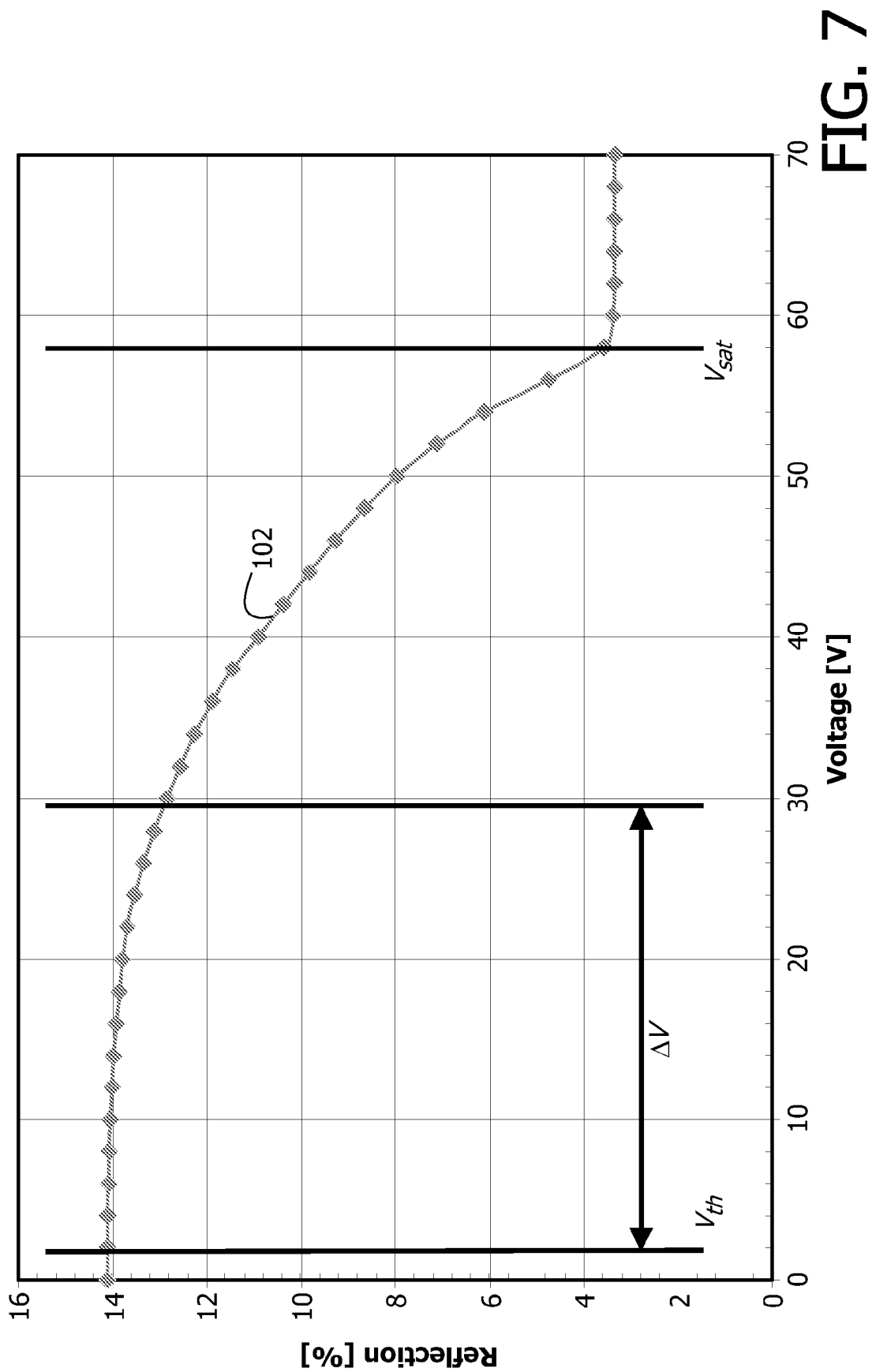
FIG. 7 shows the measured reflection as a function of voltage for a typical scattering layer.

To determine the values of $V_{th}$ and $\Delta V$ for a particular scattering layer, the reflection of diffuse illumination as a function of applied voltage across the particular scattering layer has to be measured. FIG. 7 shows the measured reflection as function of voltage for a typical scattering layer. From FIG. 7 the following values can be determined: $V_{th}=2V$, $\Delta V=29V$. With Equation 1 it can be computed that the maximum number of rows which can be driven with passive matrix addressing (Nmax, i.e. multiplex rate) is only 1 for this typical scattering layer.

The scattering layer in this example is based on material that is commercially available from Chelix (an American company) and specified in e.g. U.S. Pat. No. 6,897,936.

The reflection-voltage curve of FIG. 7 shows that the amount of reflection gradually decreases from approximately 14% to approximately 3% when the applied voltage increases from 3 volt to 60 volt. The difference between the maximum amount of reflection and minimum amount of reflection is relatively small, i.e. approximately 11%. However, the fact that the amount of reflection changes gradually over a relatively large range of voltages, instead of with a steep step is a more serious issue. It makes the particular scattering layer hardly or even not suitable if regions of the output are to be controlled independently using passive matrix addressing.

The use of an additional reflector, or the control of the second substrate arrangement as a reflector, alters the curve of FIG. 7 in such a way that the response is more suitable for a passive matrix switching arrangement.

Figure 8:
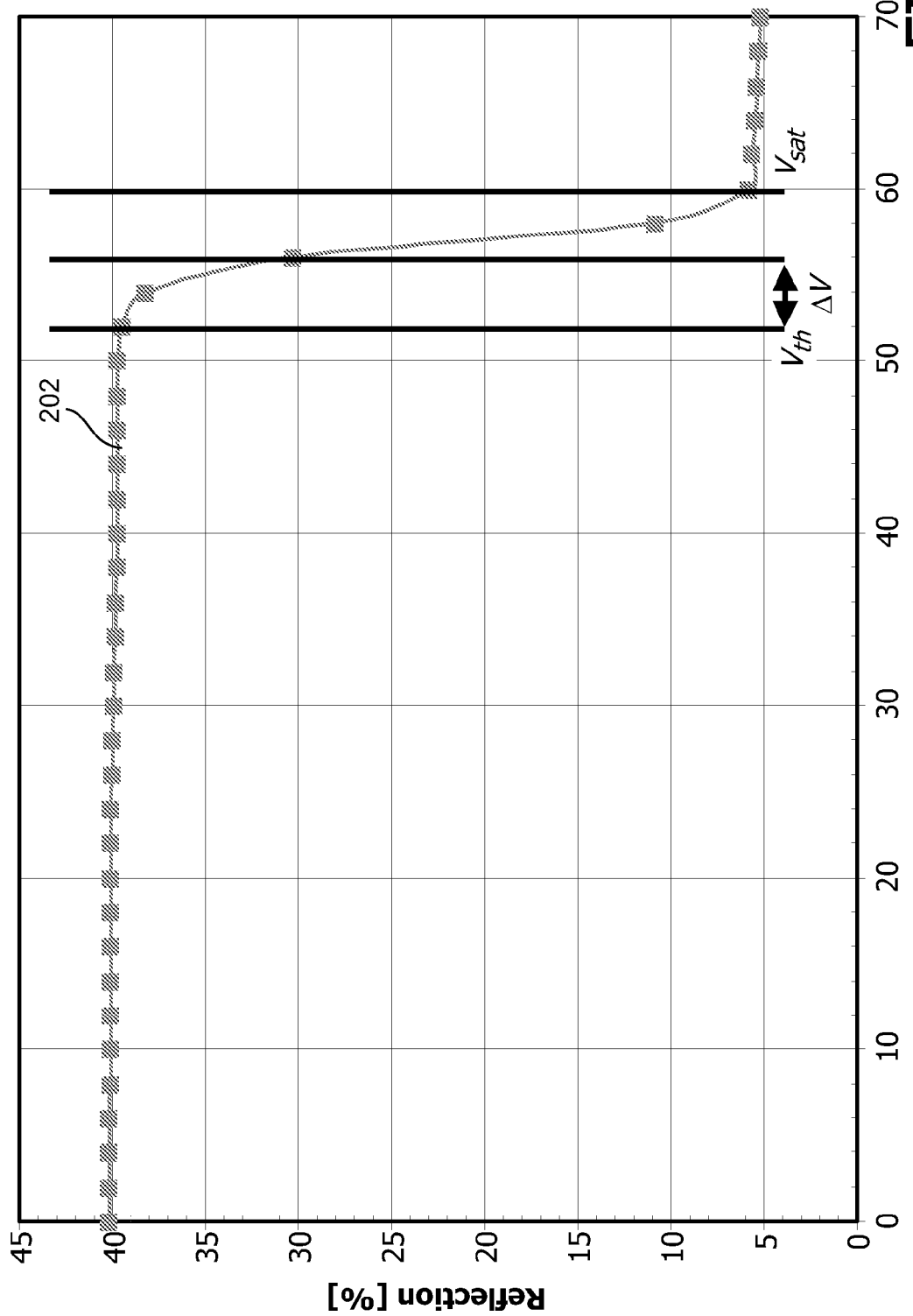
FIG. 8 shows the measured reflection as a function of voltage for a scattering layer using a reflecting layer.

FIG. 8 shows the measured reflection as function of voltage for the scattering layer used for the analysis of FIG. 7 with a reflective layer adjacent to it. The reflection-voltage curve of FIG. 8 shows that the amount of reflection is substantially constant for the large range of voltages from 0 volt to 52 volt. Then the amount of reflection drops significantly over a relatively small range of voltages. The difference between the maximum amount of reflection and minimum amount of reflection is relatively large, i.e. approximately 35%. Both aspects, i.e. the fact that the amount of reflection changes relatively much over a relatively small range of voltages and the fact that the difference between the maximum amount of reflection and minimum amount of reflection is relatively large makes the combination of the particular scattering layer and the reflective layer suitable for application whereby light modulation is based on passive matrix addressing (so that an in an image display function can be implemented).

Figure 9:
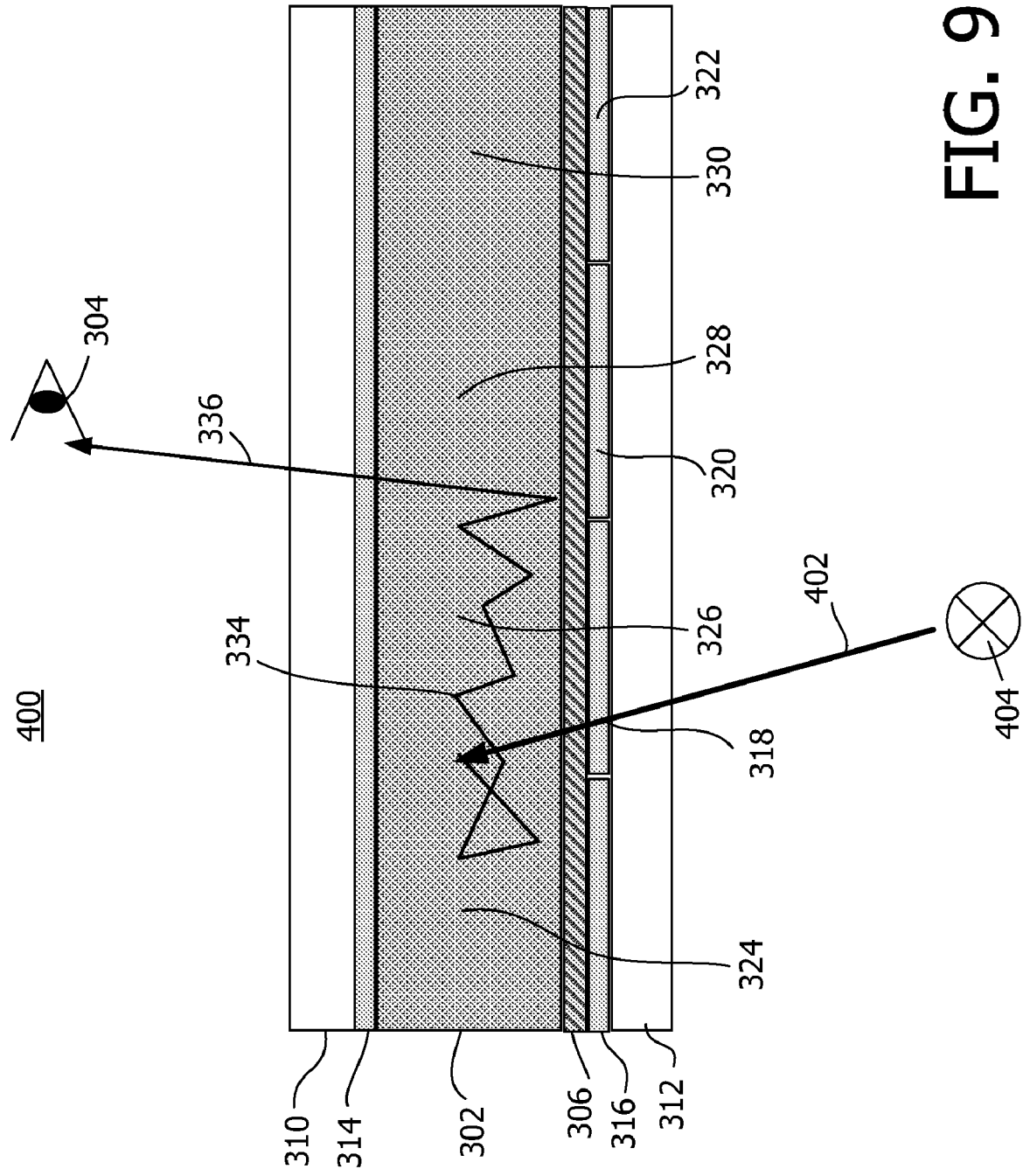
FIG. 9 shows an example of switchable scattering layer which can be used in the device of the invention.

FIG. 9 schematically shows one possible arrangement for the top (first) substrate arrangement, for use in the light output device of the invention. The arrangement 400 comprises:
   the scattering layer 302 comprising liquid crystals, which is switchable between a substantially transparent state and a scattering state, for a light beam 402;
   sets of electrodes 314-322 for switching respective portions 324-330 of the scattering layer 302 between the transparent state and the scattering state, by means of passive matrix addressing of the respective sets of electrodes;
   a reflective layer 306 for reflecting a portion 336 of the scattered light beam 334 back towards the scattering layer 302;
   a set of transparent cover plates 310-312; and
   driving means for providing appropriate voltages to the sets of electrodes 314-322.

By modulation of the voltages across the different independently controllable portions 324-330 of the scattering layer 302, corresponding patterns of more or less scattering are created. These patterns cause a modulation of the light output 336.

The electrodes can comprise indium tin oxide (ITO) but can also be indium zinc oxide (IZO) or other organic conducting materials known to those skilled in the field as suitable for use as a transparent electrode.

Preferably, the electrodes 314-322 are structured as two groups of strips of transparent conductive material, which are disposed at opposite sides of the scattering layer. Preferably, the electrodes 314 of the first group are oriented substantially orthogonal to the electrodes 316-322 of the second group. The electrodes 314 of the first group of electrodes extend over respective columns of the scattering layer 302, while the electrodes 316-322 of the second group of electrodes extend over respective rows of the scattering layer 302. By appropriately applying voltages between pairs of electrodes, each pair comprising a selected electrode 314 of the first group of electrodes and a selected electrode 316 of the second group of electrodes, different portions 324-330 of the scattering layer 302 can be addressed, i.e. the local amount of scattering can be modulated. This type of modulation is known as passive matrix addressing to the person skilled in the art of image display driving.

The scattering layer 302 comprises liquid crystals, which are stabilized by a polymer network, whereby the concentration of the polymer network is approximately 2%. In e.g. U.S. Pat. No. 6,897,936 is disclosed how such a scattering layer can be made.

The light source shown as 404 represents the LED (or other light source device) between the arrangement 400 and the other (second) substrate arrangement (not shown in FIG. 9). It is also possible to place the LED 404 between layers 306 and 302, possibly including extra glass plates. In that case, layer 2 from FIGS. 2-6 can be the same layer as 306 in FIG. 9.

The reflective layer 306 comprises means for transmission of the light being generated by the light source 404. Preferably these means are a structure of holes. As mentioned above, the reflector 306, which improves the passive matrix addressing possibilities, and particularly the achievable multiplex ratio, can be part of the second substrate arrangement. For example, if the second substrate arrangement is a switchable reflector, this reflection function can be used during a display type pixellated control of the light output of the controllable scattering layer.

The scattering layer can be a polymer LC gel. To achieve a reflection-voltage curve that is steep enough to allow multiplexing, the polymer content in the polymer-liquid crystal composite is of influence. The polymer content is preferably chosen between 0.5 and 10 wt %, more preferably between 1 and 6 wt % and more preferably between 2 and 4 wt %.

Typically, the concentration of polymers relative to the liquid crystals in commercially available scattering layers is much higher. In particular, in switchable scattering layers the concentration of polymers relative to the liquid crystals is typically 20%. The reason for that is that the mechanical properties of the polymer network are relevant. Frequently switching between the different optical states of the scattering layer having a relatively low concentration of polymers relative to the liquid crystals may result in destruction of the polymer network.

That means that the selection of the particular concentration of the polymer network in the scattering layer is determined by:
the mechanical aspects, because the polymer network should be relatively durable and stable; and
the electro-optical aspects, because the multiplex ratio of the device should be relatively high.

The liquid crystal can be nematic or chiral nematic by adding a chiral dopant to the nematic liquid crystal.

The polymer can be obtained by polymerization of a monomer previously added to the liquid crystal. In a preferred embodiment the monomer is polymerized and/or cross-linked by (UV) light. In an even more preferred embodiment the polymerization and/or cross-linking takes place while the liquid crystal is aligned. An external field, applied during polymerization, can achieve the alignment of the liquid crystal. Alternatively alignment of the liquid crystals is induced by an alignment inducing surface such as a rubbed polyimide, a surfactant, a surfactant containing polyimide or SiO2 evaporated at an oblique angle.

Figure 10:
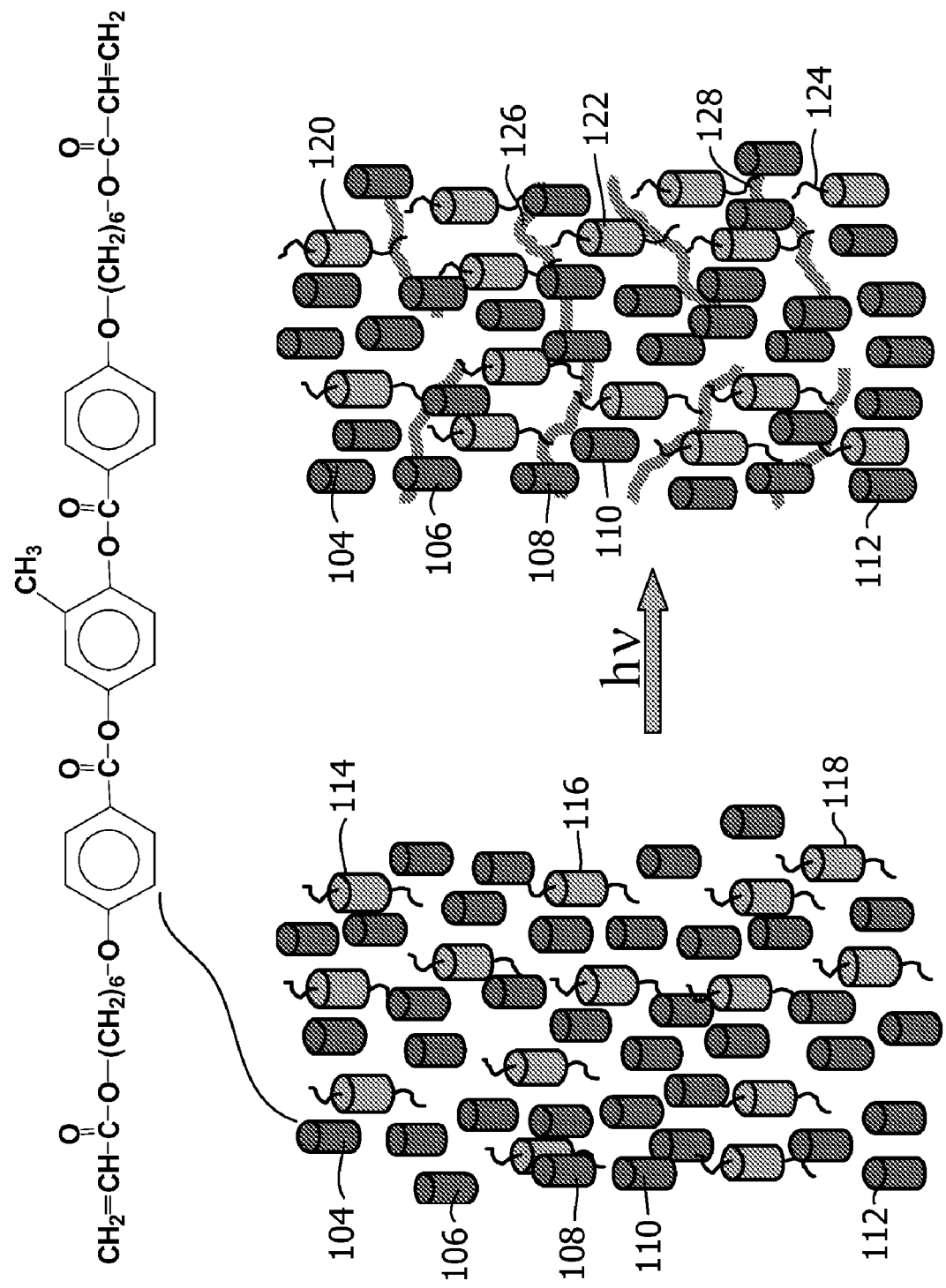
FIG. 10 schematically shows an example of process for making a scattering layer based on a liquid crystal polymer composite.

FIG. 10 schematically shows the process of making a scattering layer 302 based on a liquid crystal polymer composite. The scattering layer 302 is made by adding a predetermined amount of monomer 114-118 to a predetermined amount of liquid crystals 104-112. By means of an electric field, the molecules are directed in a required direction. Subsequently the composite is illuminated by ultraviolet light (hv) during a predetermined period of time. Under the influence of the ultraviolet light the monomer molecules 120-124 will be linked 126-128 to a polymer network. Alternatively, a relatively high temperature during a predetermined period of time is used for the cross-linking.

Figure 11:
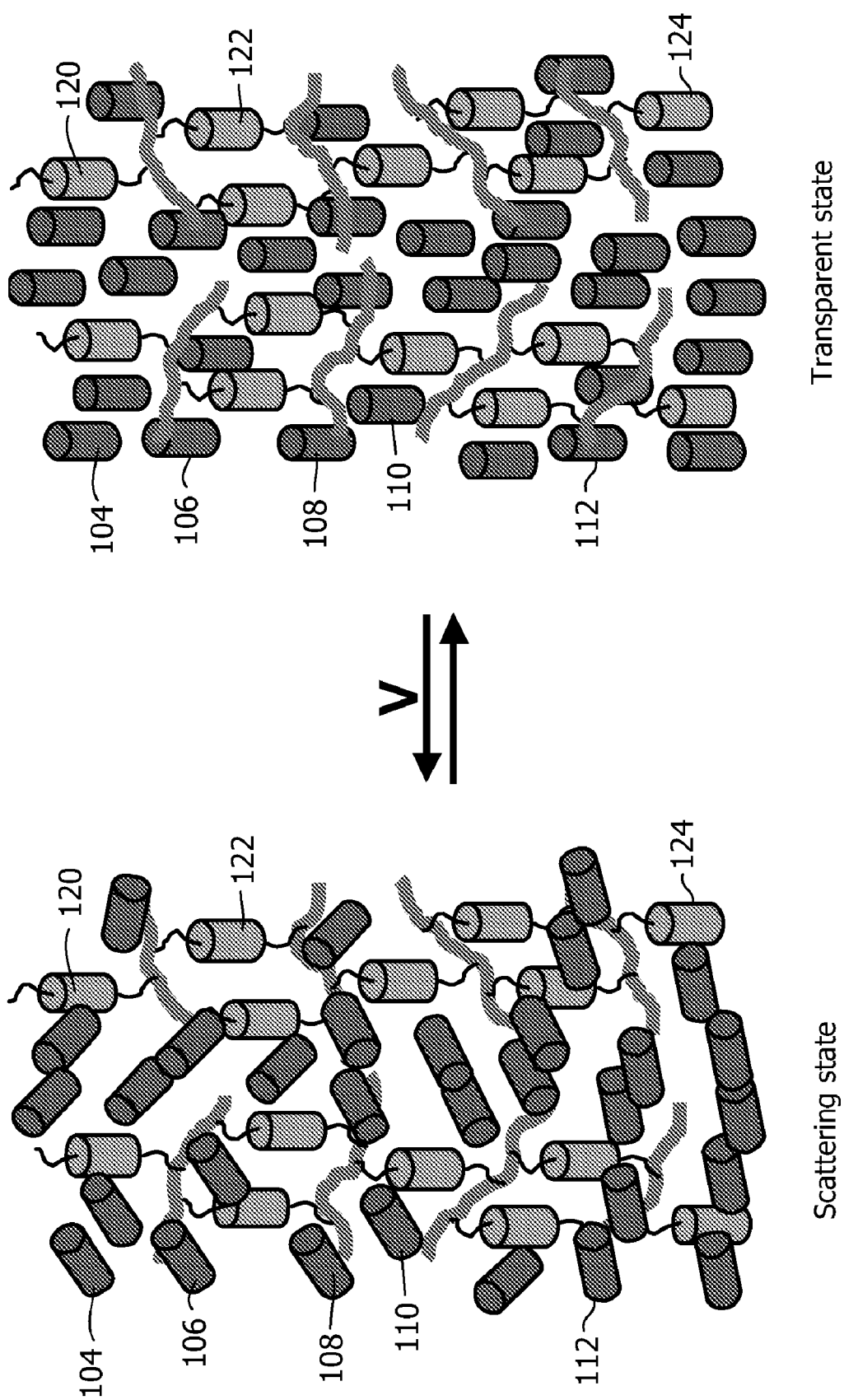
FIG. 11 schematically shows an example of the scattering state and the transparent state of a scattering layer based on a liquid crystal polymer composite.

FIG. 11 schematically shows the scattering state and the transparent state of a scattering layer 302 based on a liquid crystal polymer composite. In the transparent state the liquid crystals are aligned with the molecules of the polymer network, i.e. the molecules are oriented in the same direction. In the transparent state the liquid crystals are not aligned with the molecules of polymer network. That means that the orientations of the molecules of the polymer network and the liquid crystals are mutually different. Typically, the orientations of the liquid crystals are random.

Various other possibilities are within the scope of the various aspects of the invention, as defined by the attached claims.

Various other modifications will be apparent to those skilled in the art.

The invention claimed is:

1. A light output device having a laminated glass structure, the device comprising:
   a first substrate arrangement comprising a first glass layer, a light output surface of the device and means for controlling the level of uniformity of the light output from the light output surface;
   a second substrate arrangement comprising a second glass layer and light deflecting means;
   an electrode arrangement provided between the first and the second substrate arrangement and comprising substantially transparent or translucent electrodes;
   at least one light source provided between the first and the second substrate arrangement.

2. A device as claimed in claim 1, wherein the first substrate arrangement is switchable between at least two states having different levels of uniformity of the light output from the light output surface.

3. A device as claimed in claim 1, wherein the first substrate arrangement is switchable between a substantially transparent state and a state which provides an increased level of uniformity of the light output from the light output surface.

4. A light output device having a laminated glass structure, the device comprising:
   a first substrate arrangement comprising a first glass layer, a light output surface of the device and means for controlling the level of uniformity of the light output from the light output surface;
   a second substrate arrangement comprising a second glass layer and light deflecting means;
   at least one light source having its output optically coupled to a space between the substrate arrangements,
   wherein the first substrate arrangement is switchable between at least two states having different levels of uniformity of the light output from the light output surface.

5. A device as claimed in claim 4, wherein the first substrate arrangement is switchable between a substantially transparent state and a state which provides an increased level of uniformity of the light output from the light output surface.

6. A device as claimed in claim 4, further comprising an electrode arrangement disposed between the substrate arrangements, wherein the at least one light source is connected to the electrode arrangement.

7. A device as claimed in claim 6, wherein the electrode arrangement comprises a substantially transparent conductive material.

8. A device as claimed in claim 4, having a switchable first substrate arrangement comprising an liquid crystal (LC) layer disposed between the electrodes.

9. A device as claimed in claim 4, wherein different regions of the first substrate arrangement are independently switchable.

10. A device as claimed in claim 9, comprising a passive matrix conductor arrangement for controlling the switching.

11. A device as claimed in claim 4, wherein the second substrate arrangement is switchable between a substantially transparent state and a reflecting state.

12. A device as claimed in claim 4, wherein the second substrate arrangement is switchable between a substantially transparent state and a diffusive state.

13. A device as claimed in claim 4, wherein the first substrate arrangement has a non-uniform thickness, having increased thickness at a region corresponding to the location of the light source, and a reduced thickness at a region remote from the light source.

14. A device as claimed in claim 4, wherein the first substrate arrangement comprises a plurality of light scattering particles embedded in the glass layer with a non-uniform density, the scattering particles having increased density at a region corresponding to the location of the light source, and a reduced density at a region remote from the light source.

15. A device as claimed in claim 4, wherein the light source comprises an LED device or a group of LED devices and is embedded in a thermoplastic or resin layer, wherein each of the first and second substrate arrangements comprises a glass layer having embedded scattering particles, and wherein the or each LED device comprises an inorganic LED, an organic LED (OLED), a polymer LED (polyLED) or a laser diode.

16. A device as claimed in claim 4, further comprising means for controlling the level of uniformity by modulating the switching function.

* * * * *